(12) United States Patent
D'Souza

(10) Patent No.: US 12,742,694 B2
(45) Date of Patent: Sep. 22, 2026

(54) APPARATUS AND METHOD FOR MEASURING TORSION

(71) Applicant: Iotella Solutions Inc., Richmond (CA)

(72) Inventor: Riseley D'Souza, Richmond (CA)

( * ) Notice: Subject to any disclaimer, the term of this patent is extended or adjusted under 35 U.S.C. 154(b) by 298 days.

(21) Appl. No.: 18/590,791

(22) Filed: Feb. 28, 2024

(65) Prior Publication Data

US 2025/0271315 A1 Aug. 28, 2025

(51) Int. Cl.
*G01L 3/08* (2006.01)
*G01L 3/10* (2006.01)
*G01R 33/07* (2006.01)

(52) U.S. Cl.
CPC .............. *G01L 3/102* (2013.01); *G01R 33/07* (2013.01)

(58) Field of Classification Search
CPC ....... G01L 3/00; G01L 3/08–10; G01L 3/102; G01R 33/07
See application file for complete search history.

(56) References Cited

U.S. PATENT DOCUMENTS 3,871,215 A * 3/1975 Pratt, Jr. .................. G01L 3/12 73/862.28
5,001,937 A 3/1991 Bechtel et al.
5,067,355 A * 11/1991 Witte ...................... G01L 3/109 73/112.01
5,323,659 A 6/1994 Wakamiya et al.
5,474,813 A 12/1995 Walker et al.
5,490,431 A 2/1996 O'Mahony et al.
7,322,250 B1 1/2008 Discenzo
7,559,258 B2 7/2009 Matzoll et al.
10,274,386 B2 4/2019 Shafer et al.
11,060,932 B2 7/2021 Zerwekh
2022/0244118 A1 8/2022 Nakamura et al.

FOREIGN PATENT DOCUMENTS

CN 111043951 A * 4/2020 ............. G01B 11/26
GB 2093991 A 9/1982

OTHER PUBLICATIONS

Machine Translation of CN-11043951-A (Year: 2020).*

* cited by examiner

*Primary Examiner* — Nguyen Q. Ha
(74) *Attorney, Agent, or Firm* — McMillan LLP

(57) ABSTRACT

A system and method for measuring torsion on a rotating shaft are disclosed. The method comprises: obtaining two or more optical encoder tapes of a predetermined pattern; securing the two or more tapes a predetermined distance apart on a shaft; for each of the one of the two or more tapes, placing a corresponding sensor proximate each tape; sensing a signal from each of the two or more tapes to obtain corresponding sensor data; and using the obtained sensor data, computing torsion on the rotating shaft or power output from the rotation shaft. The system comprises: a first magnetic tape of a predetermined pattern and a second magnetic tape of a predetermined pattern secured on the rotating shaft a predetermined distance apart, a first Hall effect sensor and a second Hall effect sensor placed proximate to the first magnetic tape and the second magnetic tape respectively, and a computing device by using obtained sensor data, torsion on the rotating shaft or power output from the rotating shaft.

10 Claims, 4 Drawing Sheets

APPARATUS AND METHOD FOR MEASURING TORSION

TECHNICAL FIELD

The specification relates generally to apparatuses and methods of measuring torsion generally and in particular to a non-contact apparatus and method of measuring torsion in a shaft.

BACKGROUND

Torsion is a measure of twisting to an object resulting from applied torque, such as that observed in rotating shafts. The measurement of torsion has been traditionally done using strain gauges. A strain gauge utilizes a sensor whose electrical resistance varies as a function of applied force.

Other torsion meters and associated apparatuses and methods of measuring torsion are also known. These methods of torsion measurement, particularly for rotating shafts often rely on contact sensors or magnetic pickup. In one set of known torsion meters, contact sensors are used detect phase displacement that is proportional to the torsion between two or more triggers placed at distinct locations on the shaft. A disadvantage of contact torsion sensors is that they suffer wear due to friction.

Other disadvantages include the difficulty of retrofitting the sensors onto existing machines, and limited angular resolution.

A magnetic pickup torsion sensing system, described in U.S. Pat. No. 4,450,729, uses differential magnetic resistor sensors for non-contact measurement. However, the device still requires retrofitting of toothed wheels onto the shaft. Another embodiment described in the aforementioned patent uses inductive sensors instead of magnetic resistors. However, while useful when installed upon manufacture of the shaft, the non-contact magnetic pickup or inductive sensor detection systems are only practical at moderate rotation speeds. Moreover, toothed wheels, are difficult to manufacture uniformly, so that the toothed wheel-based devices have limited resolution. Magnetic pick-up detectors are also limited in high-speed applications, and spurious signals may be produced due to operating environment conditions such as electromagnetic interference and high temperatures.

Accordingly, although basic approaches for building torsion meters for measuring torsion are known, improvements are desired. It is desirable to improve upon one or more of efficiency, cost, ease of retrofitting, resolution and speed.

SUMMARY OF THE DISCLOSURE

In accordance with one aspect of the present disclosure, there is provided, a method for measuring torsion on a shaft. The method includes: obtaining a first and a second tape; securing the first tape and the second tape on the shaft, a predetermined distance apart; placing a first sensor proximate the first tape and placing a second sensor proximate the second tape; sensing a signal from each of the first tape and the second tape using the first sensor and the second sensor respectively to obtain corresponding sensor data; and computing power from the sensor data.

In accordance with another aspect of the present disclosure, there is provided, a system for measuring torsion on a rotating shaft, the system including: a first encoder tape secured on the rotating shaft; a second encoder tape secured on the rotating shaft a predetermined distance away from the first encoder tape; a first optical sensor disposed proximate the first encoder tape; a second optical sensor disposed proximate the second encoder tape; and a computing device including a processor and memory, the memory for storing instructions for computing at least one of twist angle, torque and power in electrical communication with the first optical sensor and the second optical sensor, wherein the first encoder tape and the second encoder tape comprise a first and second pattern respectively and wherein the first optical sensor and the second optical sensor transmit data to the computing device indicative of rotational speed for the first encoder tape and second encoder tape respectively, and wherein the computing device computes power from the sensor data.

In accordance with yet another aspect of the present disclosure, there is provided, a system for measuring torsion on a rotating shaft, the system including: a first magnetic tape secured on the rotating shaft; a second magnetic tape secured on the rotating shaft a predetermined distance away from the first magnetic tape; a first Hall effect sensor disposed proximate the first magnetic tape; a second Hall effect sensor disposed proximate the second magnetic tape; and a computing device including a processor and memory, the memory for storing instructions for computing at least one of twist angle, torque and power in electrical communication with the first and second magnetic sensors, wherein the first and second Hall effect sensors transmit sensor data to the computing device indicative of rotational speed for the first magnetic tape and second magnetic tape respectively, and wherein the computing device computes power from the sensor data.

Other technical advantages may become readily apparent to one of ordinary skill in the art after review of the following figures and description.

BRIEF DESCRIPTIONS OF THE DRAWINGS

For a better understanding of the embodiments described herein and to show more clearly how the embodiments may be carried into effect, reference will now be made, by way of example only, to the accompanying drawings in which.

Figure 1:
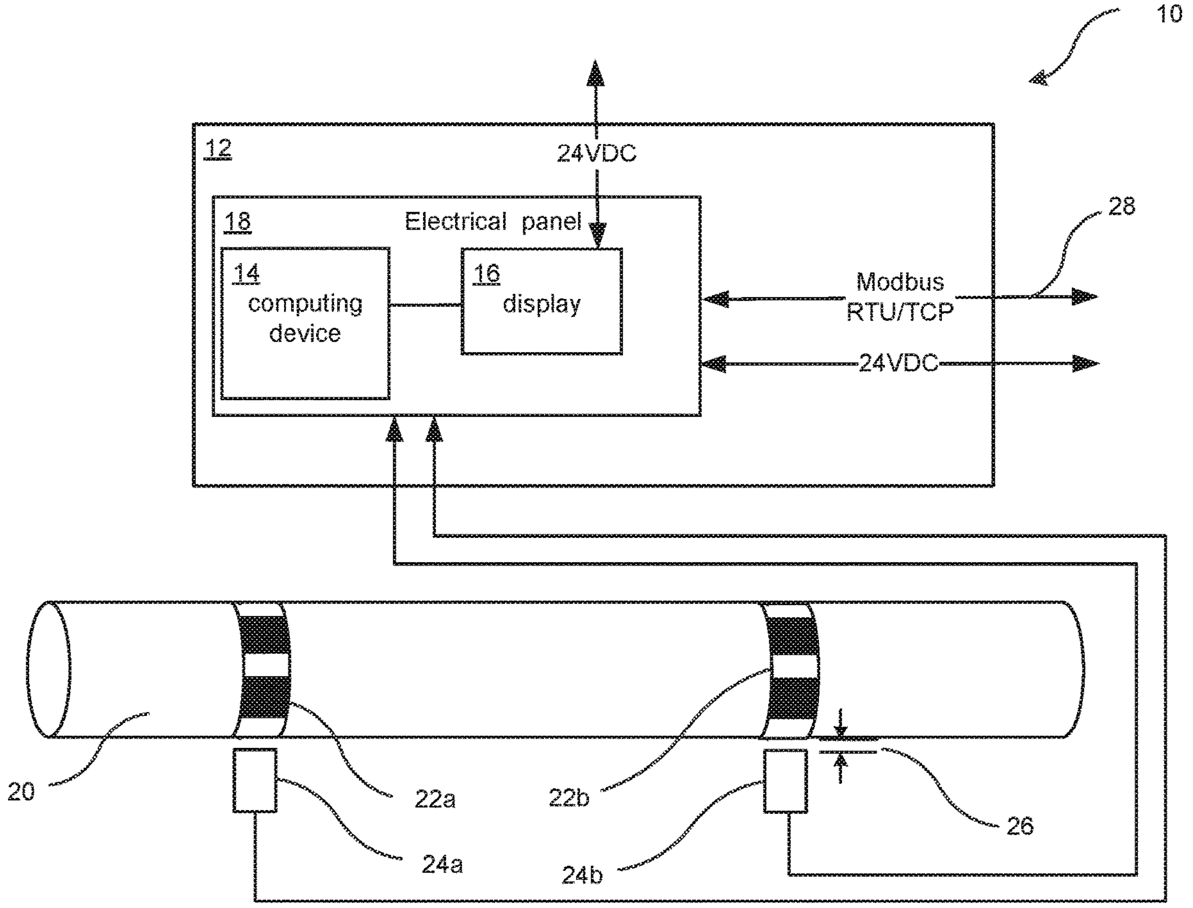
FIG. 1 is a schematic block diagram representation of a non-contact non-intrusive system for measuring torsion on a rotating shaft using encoder tapes and corresponding optical sensors, in one embodiment of the present disclosure.

Unless otherwise specifically noted, articles depicted in the drawings are not necessarily drawn to scale.

DETAILED DESCRIPTION

Directional terms such as "top," "bottom," "upwards," "downwards," "vertically," and "laterally" are used in the following description for the purpose of providing relative reference only, and are not intended to suggest any limitations on how any article is to be positioned during use, or to be mounted in an assembly or relative to an environment. The use of the word "a" or "an" when used herein in conjunction with the term "comprising" may mean "one," but it is also consistent with the meaning of "one or more," "at least one" and "one or more than one." Any element expressed in the singular form also encompasses its plural form. Any element expressed in the plural form also encompasses its singular form. The term "plurality" as used herein means more than one, for example, two or more, three or more, four or more, and the like.

In this disclosure, the terms "comprising", "having", "including", and "containing", and grammatical variations thereof, are inclusive or open-ended and do not exclude additional, un-recited elements and/or method steps. The term "consisting essentially of" when used herein in connection with a composition, use or method, denotes that additional elements, method steps or both additional elements and method steps may be present, but that these additions do not materially affect the manner in which the recited composition, method, or use functions. The term "consisting of" when used herein in connection with a composition, use, or method, excludes the presence of additional elements and/or method steps.

For clarity of illustration, where considered appropriate, reference numerals may be repeated among the Figures to indicate corresponding or analogous elements. In addition, numerous specific details are set forth in order to provide a thorough understanding of the embodiment or embodiments described herein. However, it will be understood by those of ordinary skill in the art that the embodiments described herein may be practiced without these specific details. In other instances, well-known methods, procedures and components have not been described in detail so as not to obscure the embodiments described herein. It should be understood at the outset that, although embodiments are illustrated in the figures and described below, the principles of the present disclosure may be implemented using any number of techniques, whether currently known or not. The present disclosure should in no way be limited to the implementations and techniques illustrated in the drawings and described in this disclosure.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or as a non-limiting example, and not necessarily as "preferred" over other embodiments. Further definitions for terms may be set out herein; these may apply to prior and subsequent instances of those terms, as will be understood from a reading of the present description. It will also be noted that the use of the term "a" or "an" will be understood to denote "at least one" in all instances unless explicitly stated otherwise or unless it would be understood to be obvious that it must mean "one".

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Any module, unit, component, server, computer, terminal, engine or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

According to a first embodiment of the present disclosure, a non-contact non-intrusive system 10 for measuring torsion is illustrated in FIG. 1. The depicted system 10 is suitable for measuring torque on a rotating shaft 20 using optical sensors 24*a*, 24*b* (individually and collectively "optical sensors 24").

As depicted in FIG. 1, corresponding high contrast encoder tapes 22*a*, 22*b* (individually and collectively "encoder tapes 22") respectively are secured to the shaft 20 and rotate along with the shaft. Optical sensors 24*a*, 24*b* are disposed near encoder tapes 22*a*, 22*b* respectively, to pick up varying light intensities reflected by the portions of encoder tapes 22.

High contrast encoder tapes 22 include an alternating pattern of contrasting optical properties such as dark/bright, or black/white, or non-reflective/reflective etc. These patterns lead to an alternating intensity of reflected light to be picked up by the corresponding optical sensors 24. Each optical sensor 24 may be secured to a mounting bracket to ensure its proximate placement to the corresponding encoder tape 22 on the shaft 20. Encoder tapes 22, in the depicted embodiment depicted in FIG. 1, are wrapped around the entire circumference of shaft 20. In other embodiments, encoder tapes may be wrapped partially but not entirely around the circumference of the shaft.

In the depicted embodiment the gap 26 between the optical sensors 24 disposed proximate encoder tapes 22 is about 0.8 mm to 12 mm and the shaft 20 is greater than 100 mm in diameter. For example, a shaft of about 258 mm in diameter can be used. In other embodiments, other diameters or gap distances may be used. In the depicted embodiment, the shaft 20 is solid. In other embodiments, partially hollow shafts may be used.

As depicted in the embodiment shown in FIG. 1, the alternating pattern of optical properties etched onto the encoder tapes 22 is uniform. However, in alternate embodiments, other patterns may be used.

Encoder tapes 22 are disposed on a rotating shaft 20 whose torque is to be computed, at a predetermined distance apart. In the depicted embodiment, the drive-end of shaft 20 is on the right side, while the non-drive end is on the left side. Alternately, in other embodiments, the drive and non-drive ends may be reversed.

Each corresponding optical sensor 24*a*, 24*b* is placed proximate the respective tape 22*a*, 22*b* to provide an electrical signal that provides a measure of the rotation of each tape 22*a*, 22*b* based on the corresponding sensor readings. In the depicted embodiment, optical sensors 24 are optical line sensors. Common formats of the output of the lines sensors include the standard high transistor logic (HTL) and transistor-to-transistor logic (TTL).

Computations of torque and power are then automatically carried out using a computing device 14 which includes a processor, and memory storing processor executable instruction that implement a high-speed timer/counter module. [In the depicted embodiment, a programmable logic controller (PLC) is used for the high-speed timing. In other embodiments, a dedicated processor/timing circuit/FPGA may be used for all the timing and a PLC is used for processing and computing]. Computing device 14 is in electrical communication with each of the sensors 24. In the depicted embodiment, a room 12 (e.g., an engine room in a vessel) may house the computing device 24 and a display unit 16; and an electrical panel 18 may be disposed between computing device 14 and the sensors 24. Processing of the timing is performed in close proximity to the optical sensors 22 irrespective of the method chosen (PLC/FPGA etc). HMI/Display can be located anywhere depending on installation requirements.

A data link 28, which in the depicted embodiment is a Modbus TCP/RTU, is used for data communications. The communication over data link 28 using Modbus TCP/RTU may include communication of system 10 with another system that measures torsion in another shaft (similar to shaft 20) or communicate with another system (example alarm/monitoring system). In other embodiments, other types of wired or wireless data link, may be used.

Display unit 16 in embodiments that are implemented in a vessel or a ship may be powered by a 24 VDC and may be in an engine control room 12. Display unit 16 may display power in BHP (brake horsepower) or other units. As may be appreciated by a person of skill in the art, various user interfaces may be used to display the computed figures using graphical or numerical representations. Other embodiments of system 10 need not be implemented in ships but may be deployed on land or in other settings.

In computing device 14, a high-speed timer/counter module is used for signal processing. As noted above, in the depicted embodiment, computing device 14 is formed as a PLC which is an industrial microprocessor-based controller with programmable memory used to store program instructions. The timer/counter module is used to read in the sensor signals and process them to compute and display (e.g. on display unit 16) various parameters including torque and power. In other embodiments, other forms of computing devices or processing circuits may be used.

Figure 2:
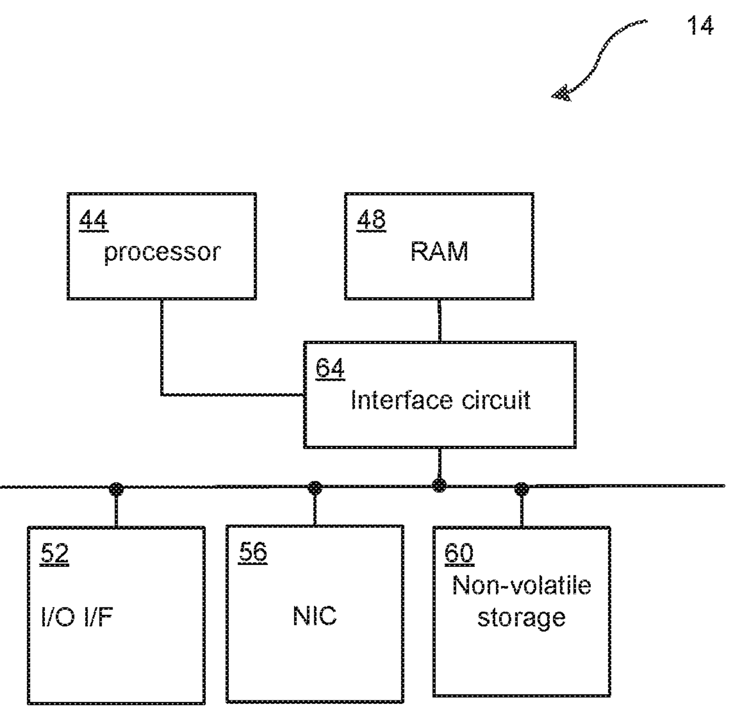
FIG. 2 is a schematic block diagram of several hardware and data forming part of the computing device shown as part of the system of FIG. 1.

FIG. 2 depicts a simplified block diagram of various elements of computer system 14. As shown, computer system 14 has several physical and logical components including a processor 44, which may be the form of a microcontroller, microprocessor, or a central processing unit ("CPU"), as well as random access memory ("RAM") 48, an input/output ("I/O") interface 52, a network interface 56, and non-volatile storage 60. A high-speed interface circuit 64 enables processor 44 to communicate with the other components. Processor 44 executes processor executable instructions in the form of at least an operating system, and a one or more applications including software modules for computing twist angle, torque and power as will be elaborated below.

RAM 48 provides relatively responsive volatile storage to processor 44. I/O interface 52 allows input to be received from one or more peripheral devices, such as a keyboard, a mouse, etc., and outputs information to output devices, such as a display and/or speakers. Network interface 56 permits wired or wireless communication with other computing devices over computer networks such as the Internet. Non-volatile storage 60 stores the operating system and programs, including computer-executable instructions for implementing the software implemented portions of modules in computing device 14 and associated code, data structures and objects. During operation of computing device 14, the operating system, the programs and the data may be retrieved from non-volatile storage 60 and placed in RAM 48 to facilitate execution.

In operation, each optical sensor 24 picks up optical signals from the corresponding encoder tape 22. The signal is then fed into a high-speed timer/counter module in computing device 14 which is in data communication with the sensors 24.

In one embodiment, system 10 samples and measures revolutions per minute (RPM) and phase differences (e.g., in microseconds) from the sensor pulses. Several pulses are generated per shaft revolution. Torque and power calculations are computed over a predetermined number of shaft revolutions. In the depicted embodiment, a 5 mm incremental encoder tape is used. Accordingly, the number of pulses depends on the diameter and speed of the shaft and varies from 20-250 pulses/revolution. Torque and power are calculated using a moving average over a time period that is user defined, and ranges from 1-2 seconds for the depicted embodiment.

After initial set up, system 10 may require no further calibration unless the position of the sensors 24 or their mounting brackets have changed, or the encoder tapes are replaced.

For power calculations, the twist angle θ which measures the twist of the shaft 20 between the sensors 24 is first computed as:

$$\theta = 2*\pi*(RPM)*(\text{Time Difference})/60{,}000{,}000\ \text{rad} \tag{1}$$

Time Difference is the moving average time difference between the edge transitions between the sensors. This angle is then used to compute the torque T:

$$T = G*J*\theta/I \tag{2}$$

where T=Torque (Nm), G=Modulus of Rigidity, J=Polar area moment of Inertia, θ=Angle of twist (rad) and I=distance between sensors.

The power P is then computed as:

$$P=2*\pi*(\text{Average } RPM)*T/60. \tag{3}$$

In the depicted embodiment, averages are computed to account for variations in torque transmitted, differences due to torsional vibrations and for easier viewing. The processor 44 and memory in computing device 14 as well as the patterns and dimensions of encoder tapes 24 are chosen to ensure the signals are capable of being processed by the hardware.

In the depicted optical embodiment of system 10, the encoder tapes 22 are made from scratch. The dimensions of the encoder tapes may depend on the diameter of shaft 20. In the depicted embodiment the length of the tapes has intervals of 5 mm or higher. In other embodiments intervals of 10 mm can be used.

It is desirable to provide optical encoder tapes of appropriate size, shape and pattern and to ensure that the processing circuitry of device 14 and software can provide accurate computation without requiring large computing resources. In some embodiments, custom encoder tapes at specified pitches can be manufactured. In other embodiments, standard tapes may be used. Embodiments of the present disclosure are used to calculate brake specific fuel consumption which is a good indicator of efficiency as well as a method to compute and track green house gas (GHG) emissions.

Advantageously, the torsionmeter system 10 works in a non-contact/non-intrusive way whereby only application of the tape to the shaft of interest is needed to operate, and the rest of the system can be completely decoupled from the engine or motor or its operations.

As a generalization of the embodiment of FIG. 1, multi-engine applications driving single or multiple shafts may be realized in which, power from each prime mover may be calculated in order to better control load sharing between prime movers.

Figure 3:
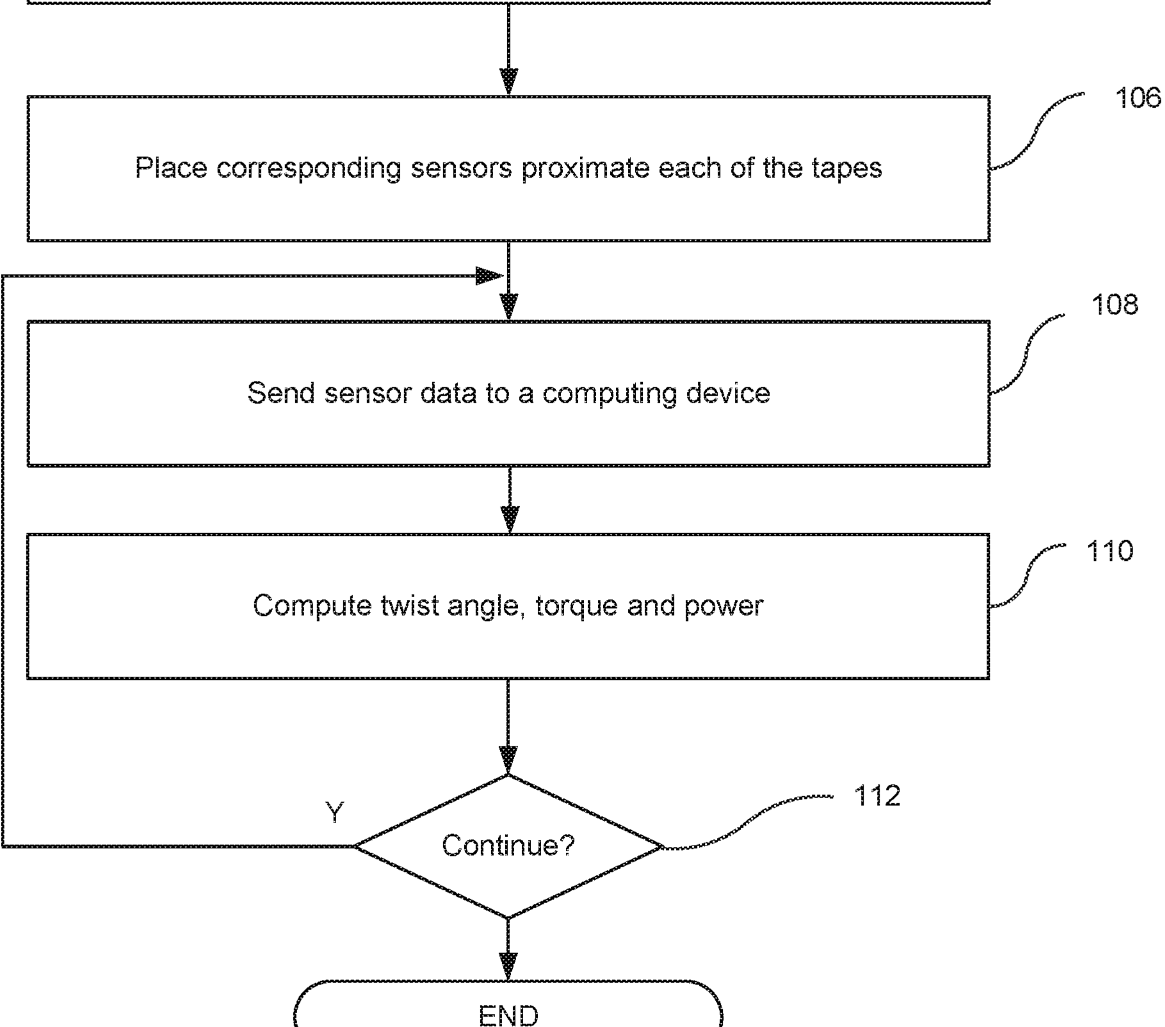
FIG. 3 is a flowchart of a method for measuring torsion on a rotating shaft using the encoder tapes and corresponding optical sensors of the system of FIG. 1.

FIG. 3 depicts a flowchart summarizing the steps of a method, which is an example of an embodiment of a method, utilizing the system of FIG. 1 or another embodiment described with reference to FIG. 4. As depicted, the method 100 starts by preparing optical encoder tapes of a predetermined pattern or magnetic tapes (step 102).

The method then applies or secures the tapes a predetermined distance apart on a shaft such as shaft 20 of FIG. 1 (step 104). The distance between the tapes will be used for determination of power and torque and other figures as noted above.

The method then places optical or magnetic sensors (e.g., sensors 24 or sensors 84) proximate each of the tapes (e.g., tapes 22 or tapes 82 respectively) at step 106.

As can be appreciated, the steps 102, 104, 106 allow for ease of retrofitting an existing shaft and permit non-contact non-intrusive measurement.

In the embodiment of FIG. 1, the opening gap or distance between optical sensors 24 and encoder tapes 22 on the shaft may range from 0.8 mm to 12 mm. For magnetic tapes 82 and corresponding sensors 84 depicted in FIG. 4, the gap may range from 0.5 mm to 5.0 mm.

At step 108, sensor data is sent to a computing device (e.g. device 14) and at step 110 twist angle, torque and power are computed.

At step 112 it is determined whether to continue reading data from the sensors, and if not, the method then terminates.

Hall Effect Sensors

In another embodiment of the present disclosure, Hall effect sensors may be used with corresponding magnetic tapes.

Figure 4:
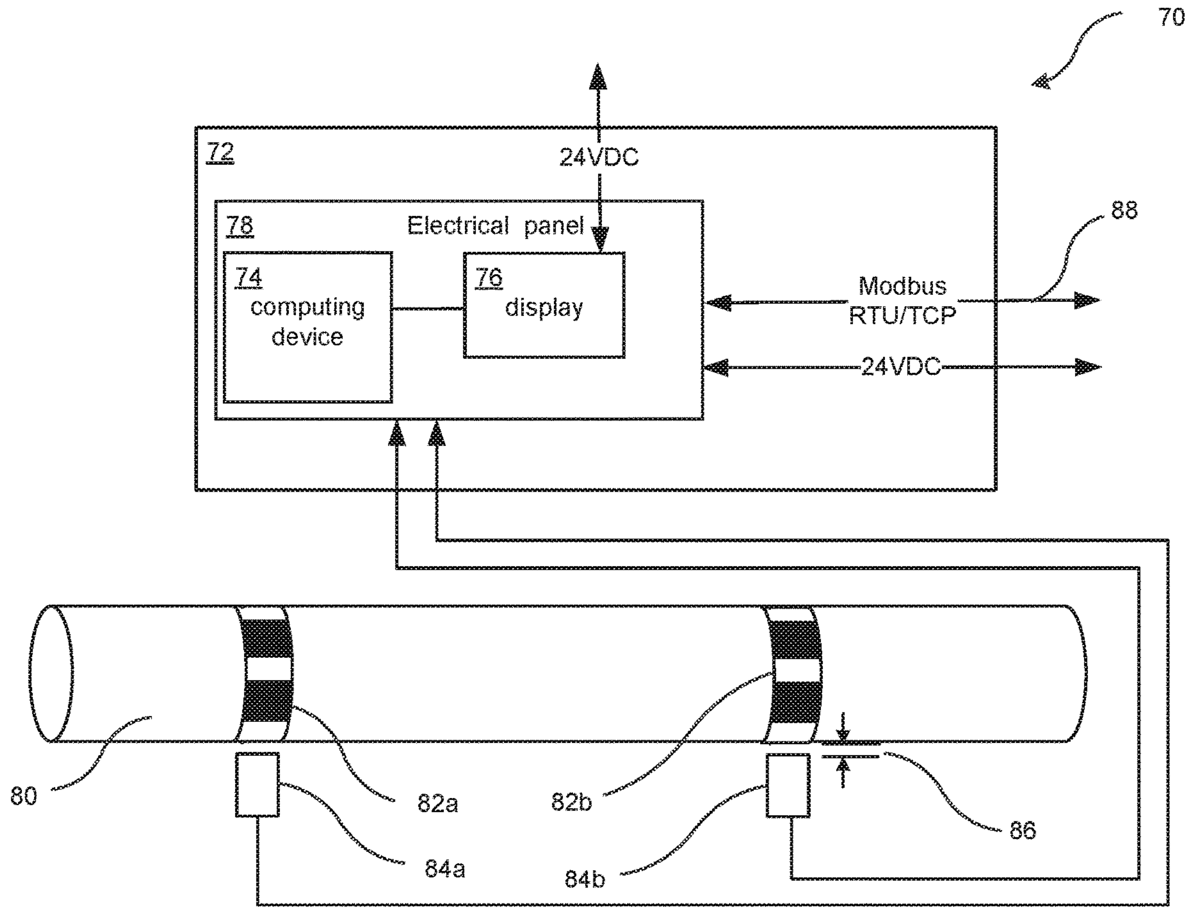
FIG. 4 is a schematic block diagram representation of a system for measuring torsion on a rotating shaft using magnetic tapes and corresponding Hall effect sensors, in another embodiment of the present disclosure.

According to a second embodiment of the present disclosure, a system 70 for measuring torsion is illustrated in FIG. 4. The depicted system 70 is suitable for measuring torque on a rotating shaft 80 using Hall effect sensors 84*a*, 84*b* (individually and collectively "Hall effect sensors 84"). Aspects and components of system 70 that are similar to corresponding components in system 10 will not further described.

As depicted in FIG. 4, corresponding high contrast magnetic tapes 82*a*, 82*b* (individually and collectively "magnetic tapes 82") respectively are secured to the shaft 80 and rotate along with the shaft. Hall effect sensors 84*a*, 84*b* disposed near magnetic tapes 82*a*, 82*b* respectively, to pick up varying voltages corresponding to the magnetic field generated by the portions of the rotating magnetic tapes 82.

A Hall effect sensor detects and generates an output voltage when magnetic flux density in the area surrounding the Hall sensor reaches a certain threshold. A Hall sensor includes a small rectangular slice of p-type semiconductor material (a Hall plate), such as gallium arsenide (GaAs), indium antimonide (InSb), or indium arsenide (InAs), that carries a continuous current. A Hall effect sensor functions as an analog sensor returning voltage. Hall sensor's separation from the Hall plate can be calculated using the known magnetic field. The relative position of the magnets can be determined using the sensor set.

Magnetic tapes 84 are disposed on a rotating shaft 80 whose torque is to be computed, at a predetermined distance apart. In the depicted embodiment, the drive-end of shaft 80 is on the right side, while the non-drive end is on the left side. Alternately, in other embodiments, the drive and non-drive ends may be reversed.

Each corresponding Hall effect sensor 84*a*, 84*b* is placed proximate the respective tape 82*a*, 82*b* to provide an electrical signal that provides an individual measure of the rotation of each tape 82*a*, 82*b* based on the Hall sensor readings.

Computations of torque and power are then automatically carried out using a computing device 74 that includes a processor and a high-speed timer/counter module, in electrical communication with each of the sensors 84. In the depicted embodiment, a room 72 (e.g., an engine room in a vessel) may house the computing device 84 and a display unit 76; and an electrical panel 78 may be disposed between computing device 74 and the sensors 84.

A data link 88, which in the depicted embodiment is a Modbus TCP/RTU, is used for data communications. The communication over data link 88 using Modbus TCP/RTU may include communication of system 70 with another system that measures torsion in another shaft (similar to shaft 80). In other embodiments, other types of wired or wireless data link, may be used.

Similar to FIG. 1 display unit 76 in embodiments that are implemented in a vessel or a ship may be powered by a 24 VDC and may be in an engine control room 72. Display unit 76 may display power in BHP (brake horsepower) or other units. As may be appreciated by a person of skill in the art, various user interfaces may be used to display the computed figures using graphical or numerical representations. Other embodiments of system 70 need not be implemented in ships but may be deployed on land or in other settings. In computing device 74, a high-speed timer/counter module is used for signal processing. As noted above, in the depicted embodiment, computing device 74 is formed as a PLC. The timer/counter module is used to read in the sensor signals and process them to compute and display various parameters including torque and power. In other embodiments, other forms of computing devices or processing circuits may be used. In this embodiment, the opening gap or distance between sensors 84 and tapes 82 on the shaft 80 ranges from 0.5 mm to 5 mm.

In operation, the computation of power in the Hall effect embodiment of FIG. 4 is the same as that described for the embodiment of FIG. 1 and uses equations (1), (2) and (3) as illustrated above to compute the twist angle θ using the Time Difference; the torque T; and the power P respectively.

Combined Optical and Hall Effect Sensors

Embodiments of the present disclosure include two unique methods of measuring the pulse times: namely a first method of utilising optical sensors with corresponding encoder tapes and a second method of utilizing Hall sensors with corresponding magnetic tapes.

Either the optical or magnetic embodiments of the torsionmeter can be used with flowmeters for the prime mover to calculate brake specific fuel consumption with data logging either locally or remotely i.e., on a server via a network or on the cloud.

The integration the optical and magnetic methods with flowmeters for the prime mover can be used to calculate Brake Specific Fuel Consumption with local or cloud data logging. Flowmeters calculate the fuel oil consumption. If power is known, then the brake specific fuel oil consumption=gm/kWh where gm denotes grams of fuel used.

Although specific advantages have been enumerated above, various embodiments may include some, none, or all of the enumerated advantages.

Persons skilled in the art will appreciate that there are yet more alternative implementations and modifications possible, and that the above examples are only illustrations of one or more implementations. The scope, therefore, is only to be limited by the claims appended hereto and any amendments made thereto.

What is claimed is:

1. A method for measuring torsion on a shaft, the method comprising:

obtaining a first tape and a second tape;

securing the first tape and the second tape on the shaft, a predetermined distance apart;

placing a first sensor proximate the first tape and placing a second sensor proximate the second tape;

sensing a signal from each of the first tape and the second tape using the first sensor and the second sensor respectively to obtain corresponding sensor data; and computing, by using the obtained sensor data, at least one of torsion on the rotation shaft and power output from the rotating shaft, wherein the first tape is a first magnetic tape, the second tape is a second magnetic tape, the first sensor is a first Hall effect sensor, and the second sensor is a second Hall effect sensor.

2. The method of claim 1, wherein said computing said power comprises computing a twist angle θ as:

$$\ominus = 2*\pi*(RPM)*(\text{Time Difference})/60{,}000{,}000 \text{ rad}$$

wherein RPM is revolutions per minute of the shaft and Time Difference is a moving average of time difference between corresponding edge transitions from the first sensor and the second sensor.

3. The method of claim 2, wherein said computing said power further comprises:

computing a torque T as T=G*J*θ/l wherein the torque is measured in Nm,

G=Modulus of Rigidity,

J=polar area moment of inertia,

θ=angle of twist in radians (rad) and l=said predetermined distance between the first tape and the second tape.

4. The method of claim 3, further comprising computing the power P as:

$$P=2*\pi*(RPM)*T/60.$$

5. The method of claim 4, wherein the torque T or the power P is computed over a predetermined number of revolutions of the shaft.

6. The method of claim 5, wherein the predetermined number of revolutions is 50 or less.

7. A system for measuring at least one of direction, twist angle, torque and power on a rotating shaft, the system comprising:

a first magnetic tape secured on the rotating shaft;

a second magnetic tape secured on the rotating shaft a predetermined distance away from the first magnetic tape;

a first magnetic sensor disposed proximate the first magnetic tape;

a second magnetic sensor disposed proximate the second magnetic tape; and a computing device comprising a processor and memory in electrical communication with the first and second magnetic sensors, the memory for storing instructions for computing said at least one of twist angle, torque on the rotating shaft and power output from the rotating shaft, wherein the first and second magnetic sensors transmit sensor data to the computing device indicative of rotational speeds for the first magnetic tape and the second magnetic tape respectively, and a moving average time difference between edge transitions between the sensors, and wherein the computing device computes, by using the transmitted sensor data, at least one of the twist angle, torque on the rotating shaft and the power output from the rotating shaft.

8. The system of claim 7, wherein a distance between the first magnetic sensor and the first magnetic tape ranges from about 0.5 mm to about 5.0 mm.

9. The system of claim 7, wherein a distance between the second magnetic sensor and the second magnetic tape ranges from about 0.5 mm to about 5.0 mm.

10. The system of claim 7, wherein at least one of the first magnetic sensor and the second magnetic sensor is a Hall effect sensor.

* * * * *